United States Patent [19]

Scanlan et al.

[11] 4,053,976
[45] Oct. 18, 1977

[54] METHOD OF MAKING NB₃SN COMPOSITE WIRES AND CABLES

[75] Inventors: Ronald M. Scanlan, Schenectady, N.Y.; William A. Fietz, Oak Ridge, Tenn.

[73] Assignee: General Electric Company, Schenectady, N.Y.

[21] Appl. No.: 590,819

[22] Filed: June 27, 1975

[51] Int. Cl.² .................................... H01V 11/00
[52] U.S. Cl. ..................... 29/599; 204/37 T
[58] Field of Search ........... 29/599, DIG. 2, 420.5; 204/37 T

[56] References Cited

U.S. PATENT DOCUMENTS

| | | | |
|---|---|---|---|
| 2,930,106 | 3/1960 | Wrotnowski | 335/216 |
| 2,995,475 | 8/1961 | Sharpless | 204/37 T |
| 3,124,455 | 3/1964 | Buehler et al. | 75/214 |
| 3,167,692 | 1/1965 | Matthias | 335/216 |
| 3,309,179 | 3/1967 | Fairbanks | 204/37 T |
| 3,395,040 | 7/1968 | Prichard et al. | 117/227 |
| 3,397,084 | 8/1968 | Krieglstein | 29/599 UX |
| 3,429,032 | 2/1969 | Martin et al. | 29/599 |
| 3,458,293 | 7/1969 | Schindler | 29/599 UX |
| 3,525,150 | 8/1970 | Deiness | 29/599 |
| 3,595,693 | 7/1971 | Cecil et al. | 29/599 |
| 3,625,662 | 12/1971 | Roberts et al. | 29/599 |
| 3,674,553 | 7/1972 | Tachikawa et al. | 29/599 |
| 3,829,963 | 8/1974 | McDougall et al. | 29/599 |
| 3,838,503 | 10/1974 | Suenaga et al. | 29/599 |

Primary Examiner—C.W. Lanham
Assistant Examiner—V. K. Rising
Attorney, Agent, or Firm—Charles T. Watts; Joseph T. Cohen; Jerome C. Squillaro

[57] ABSTRACT

By providing a nickel or copper overcoat to a tin coating on a niobium-copper multifilamentary composite wire, one can avoid the necessity for choosing between poor superconducting properties due to tin droplet formation and substantially increasing production costs by adding a number of special processing steps.

9 Claims, 1 Drawing Figure

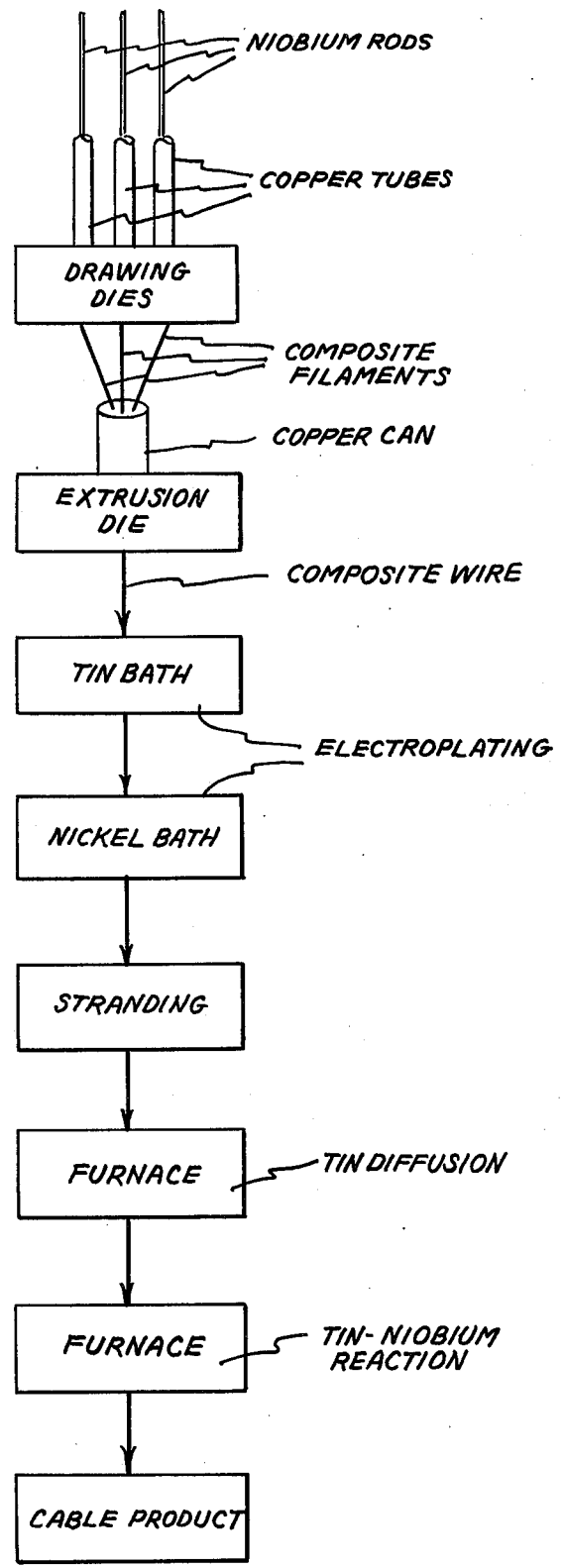

METHOD OF MAKING Nb₃SN COMPOSITE WIRES AND CABLES

The present invention relates generally to superconducting wires and cables and is more particularly concerned with a novel and economical method for making Nb₃Sn composite wires and cables.

BACKGROUND OF THE INVENTION

The combination in Nb₃Sn of brittleness and superior superconducting properties has stimulated a number of prior art attempts to devise methods enabling fabrication of various forms, particularly wires and cables, useful in the construction of devices such as high-field magnets, motors and generators. One such method is an external diffusion process which involves drawing niobium in a pure copper matrix to provide a multifilament niobium wire, plating tin on the copper surface of the wire and diffusing the tin into the copper matrix for reaction with the niobium. After coiling or otherwise forming the wire to preferred shape, the wire is heated to react the tin with the niobium and produce the superconducting Nb₃Sn phase in the wire. While the brittleness problem is thereby avoided during the forming or shaping stage, superconducting properties are degraded to the extent that the tin tends to form droplets (tin spots) on the wire surface during the diffusion-heating step. These tin spots remain as flaws and mechanically weak spots in the ultimate superconducting product.

Tin spots can be avoided in this process by applying the tin in incremental amounts in a number of separate plating steps with intermediate anneals to homogenize the materials. This procedure, however, is time consuming and expensive to carry out.

Another method which avoids tin spots, but does not require repeated plating steps and anneals, involves the use of bronze rather than copper as the matrix material. Reduction of the composite wire to final size, however, requires a number of draing operations and intermediate anneals making this process likewise time-consuming and expensive.

SUMMARY OF THE INVENTION

On the basis of our discovery to be discribed, these shortcomings of the prior art can be avoided by providing a thin layer of nicker or copper over the tin coating prior to the diffusion-heating step of the external diffusion process. Thus, the total amount of tin required can be applied to the wire at one time instead of in repeated plating steps, each followed by an anneal. Also, the necessity for using bronze instead of pure copper as a matrix material is avoided and consequently additional drawing operations, each followed by an anneal, are not required in the production of consistently good final products. The resulting method if consequently less complex and considerably less expensive to carry out than those described above and yet affords the same basicadvantage in solving the tin-spot problem of the external diffusion process.

Our discovery on which this new process is based is that an overcoating of nickel or copper of the order of 0.1 to 1.0 micron thickness is effective to prevent tin spotting at the tin diffusion temperature of the process apparently through the mechanism of decreasing the surface tension of the tin. In any event, such a layer or overcoat invariably produces the foregoing desired results and does not involve any offsetting substantial disadvantage either in terms of process complexity or cost.

Briefly described, the new method of this invention includes the steps of providing a copper-niobium composite wire of about the final desired diameter in which the niobium is in the form of elongated filaments in a copper matrix, coating the wire with tin in the amount required to react with the niobium to form Nb₃Sn phase in the wire, depositing a thin layer of nickel or copper over the tin coating to prevent formation of tin spots on the wire, heating the composite coated wire in a nuetral atmosphere to diffuse the tin into the copper and to react the tin with the niobium filaments. More in detail, in accordance with this invention, the uncoated wire will be of diameter between 5 and 50 mils, the tin coating will be between 2 and 20 microns thick and the nickel or copper overcoat or layer will be between 0.1 and 1.0 micron thick. Further, the niobium or copper layer will preferably be formed by electroplating and the wire preferably will be cabled prior to the heating step in which the tin and niobium are reacted.

DETAILED DESCRIPTION OF THE INVENTION

As indicated above, the new method of this invention is basically a two-stage fabrication process. In the first stage, mechanical preparation steps are performed while the components of the composite wire are ductile and the wire is therefore readily formable into the final desired shape or geometry such as a tightly-wound core. In the second stage, the brittle Nb₃Sn phase is formed by heating the shaped body to a temperature causing reaction of niobium with tin within the composite wire.

As we prefer to carry out the present invention, niobium rods are co-drawn in copper tubes to provide copper-clad niobium rods. A number of these rods are then loaded into a pure copper extrusion can and the assembly is extruded and subsequently cold-drawn to the desired diameter of the resulting composite wire. After the wire is cleaned, suitably in a copper bright dip solution, and rinsed, it is plated with tin in the amount required for reaction with the niobium in the wire to produce the requisite Nb₃Sn superconducting phase throughout the length of the wire. Nickel or copper is then plated on the tin coat, suitably to a thickness of only 10 to 20 percent that of the tin. The tin-coated and nickel- or copper-overcoated wire is then cabled with additional composite wires of the same kind around a central strengthening core, suitably of stainless steel or tungsten and preferably of diameter approximating that of the copper-niobium composite wire. With the cable in the form of the product ultimately desired, heat is applied (suitably 550°–580° C) to diffuse the tin more or less homogeneously through the copper matrix of the wire. Then the temperature of the wire is increased, suitably to 700°–750° C, to cause reaction of the diffused tin with the niobium filaments. If desired, heating may be carried out as a single step at a temperature in the niobium-tin reaction range, but preferably the heat treatment is in two stages to insure substantially uniform niobium-tin reaction through the cross section of the wire. In any event, however, heating is conducted in a neutral atmosphere such as dry nitrogen or argon. Air, oxygen and hydrogen atmospheres are detrimental to the desired properties of the ultimate product, and other gases which would likewise be reactive with one or more of the constituents of the composite wire would also be unsuitable as substantial heat-treatment atmosphere components.

In the unique tin overcoating step of this invention, nickel and copper have special qualifications. Either of these two metals may be employed to obtain consistently the new advantages and results of this invention. Other metals such as iron and cobalt are, however, not suitable for this purpose for one reason or another. Thus, the overcoating or second plating material deposited on the tin must be one which does not react with $Nb_3Sn$ to destroy its good superconducting properties in the ultimate product. Also, the overcoating metallic material should be plateable on tin and must be effective to reduce the surface tension of the tin and thereby prevent the tin from de-wetting the copper surface of the wire and forming droplets on it.

Those skilled in the art will gain a further and better understanding of this invention from the following illustrative, but not limiting, examples of the process of this invention as we have carried it out in actual practice:

EXAMPLE I

Niobium-copper composite filaments of about 120-mil diameter and about 90-mil niobium core diameter were prepared by co-drawing niobium rods in oxygen-free, high-conductivity, commercial grade (OFHC) copper tubes. Three hundred of these filaments were loaded into a OFHC copper extrusion can of 2⅜ inch outside diameter and the assembly was then extruded to produce a ½-inch rod which was then cold drawn to about 10-mil diameter wire size. The wire was cleaned in commercial copper bright dip solution and water-rinsed and then provided with a five-micron coating of tin which was electroplated from an aqueous acid-tin bath at a current density of five amperes per square decimeter. The bath was maintained at about 25° C during the plating operation and the bath contained 100 grams per liter stannous sulfate, 100 grams per liter sulfuric acid, two grams per liter gelatin and one gram per liter $\beta$-naphthol.

A ½-micron nickel overcoat was electroplated on the tin-coated copper-niobium composite wire from a Watts nickel bath containing 300 grams per liter nickel sulfate ($NiSO_4 \cdot 7H_2O$), 50 grams per liter nickel chloride ($NiCl_2 \cdot 6H_2O$) and 35 grams per liter boric acid ($H_3BO_3$). The bath was maintained at about 50° C during the plating operation, which was carried out at a current density of 5 amps/dm².

The resulting wire was then assembled with five other composite wires made as just described plus a 10-mil diameter stainless steel core wire to provide a seven-strand cable of about 0.015 inch outside diameter. This cable proved to be bendable around a ½-inch diameter without degradation. The cable was heat treated in two stages to diffuse the tin into the copper matrix of each of the wires and then to react the substantially homogenized tin with the niobium of the filaments within the wires. The homogenizing heating step was conducted at about 580° C in four hours and the $Nb_3Sn$ reaction step was accomplished in 50 hours at about 750° C. These heat treatments were carried out in an argon atmosphere (−70° F dewpoint).

The resulting cable product proved to have the desired superconducting current-carrying characteristics.

The drawing accompanying this specification illustrates in flow sheet form the new process of this invention as fully described above and set forth in the appended claims.

EXAMPLE II

In another operation like that described in Example I, copper was employed instead of nickel as the tin overcoating, an aqueous cyanide bath of the following composition being employed:
 26 g/l CuCN
 35 g/l NaCN 30 g/l $Na_2CO_3$
 45 g/l Rochelle salt The plating was accomplished on a current density of 5 amps/dm², with the bath being maintained at about 60° C. The homogenizing heating step in this case was carried out for a period of 10 hours at 580° C and the reaction heating step was accomplished in about 70 hours at about 700° C. the resulting wire was then cabled as described above with the results set forth in Example I.

While electroplating is preferred for despositing both the tin coating and the nickel or copper overcoat, other methods may be used in carrying out this invention and are consequently contemplated by the appended claims. Generally, however, deposition methods such as dipping are not readily controllable to provide coatings which are of uniform thickness as we prefer.

What we claim as new and desire to secure by Letters Patent of the United States is:

1. In the method of producing $Nb_3Sn$ composite wire by forming a niobium-copper composite wire in which the niobium is in the form of elongated filaments in a copper matrix, coating the wire with tin, heating the coated wire and diffusing the tin into the wire and thereafter heating the wire to cause reaction of the tin to form $Nb_3Sn$ in the wire, the combination of the step of depositing on the tin-coated wire a layer from about 0.1 to 1.0 micron thick of nickel or copper prior to the diffusion-heating step.

2. The method of claim 1 in which the nickel or copper-coated wire is cabled prior to the diffusion heating step.

3. The method of claim 1 in which the nickel or copper layer is electroplated.

4. The method of making a $Nb_3Sn$ composite wire which comprises the steps of providing a copper-niobium composite wire in which the niobium is in the form of elongated filaments in a copper matrix and extending lengthwise thereof, coating the wire with tin, depositing a layer of nickel or copper from about 0.1 to 1.0 micron thick over the tin coating, heating the composite coated wire and diffusing the tin into the copper and reacting the tin with the niobium of the filaments.

5. The method of claim 4 in which the wire is cabled prior to diffusing the tin into the wire, and in which the diffusion-heating step is carried out at a temperature below the niobium-tin reaction temperature to homogenize the tin throughout the wire.

6. The method of claim 4 in which the wire is formed around a central strengthening core into a sixstrand cable of about 0.015 inch outside diameter.

7. The method of claim 4 in which the uncoated wire diameter is between about five and 50 mils and tin coating is between about two and 20 microns thick.

8. The method of claim 4 in which the nickel or copper layer is formed by electroplating.

9. The method of claim 4 in which the uncoated wire diameter is about 10 mils, the thickness of the tin coating is about five microns, and the thickness of the nickel layer is about 0.5 micron.

* * * * *